(12) United States Patent
Youn et al.

(10) Patent No.: US 7,103,102 B2
(45) Date of Patent: Sep. 5, 2006

(54) BIT STREAM CODE LOOKUP TABLE FOR AN MPEG-4 CODE WORD

(75) Inventors: Jeongnam Youn, San Jose, CA (US); Chris Basoglu, Everett, WA (US)

(73) Assignee: Equator Technologies, Inc., Campbell, CA (US)

( * ) Notice: Subject to any disclaimer, the term of this patent is extended or adjusted under 35 U.S.C. 154(b) by 717 days.

(21) Appl. No.: 10/187,261

(22) Filed: Jun. 28, 2002

(65) Prior Publication Data

US 2003/0031259 A1    Feb. 13, 2003

Related U.S. Application Data

(60) Provisional application No. 60/301,866, filed on Jun. 29, 2001.

(51) Int. Cl.
*H04N 7/12* (2006.01)
(52) U.S. Cl. .................................... 375/240.23
(58) Field of Classification Search ............. 375/240, 375/23, 240.25, 240.26; 382/245–246; 341/67
See application file for complete search history.

(56) References Cited

U.S. PATENT DOCUMENTS

| 5,969,650 | A  | * | 10/1999 | Wilson .................... 341/67 |
| 6,298,087 | B1 | * | 10/2001 | Luna et al. ............ 375/240.25 |
| 6,647,061 | B1 | * | 11/2003 | Panusopone et al. .. 375/240.12 |
| 6,731,686 | B1 | * | 5/2004  | Sudharsanan et al. . 375/240.25 |
| 2001/0033697 | A1 | * | 10/2001 | Shimada .................... 382/246 |

OTHER PUBLICATIONS

Choi et al, "High Speed Pattern Matching For A Fast Huffman Decoder", IEEE Transactions on Consumer Electronics, vol. 41, iss. 1, Feb. 1995, pp. 97-103.*

* cited by examiner

*Primary Examiner*—Vu Le
(74) *Attorney, Agent, or Firm*—Marger Johnson & McCollom, P.C.

(57) ABSTRACT

A technique is described for decoding an MPEG-4 run-length-limited (RLL) code word using a hardware designed to decode MPEG-2 RLL code words.

10 Claims, 13 Drawing Sheets

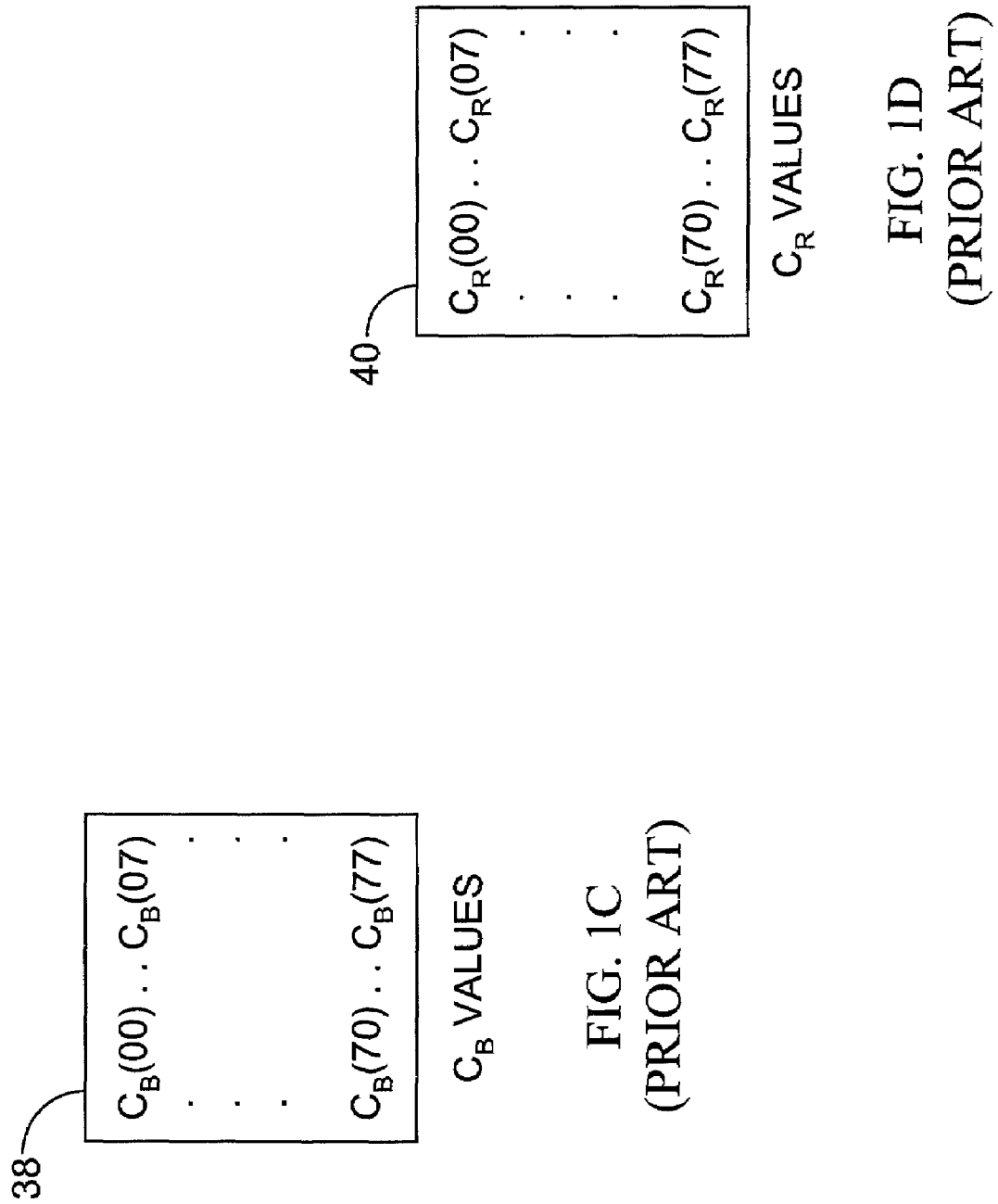

Y-DCT (00)a . . . . . . . . . . . Y-DCT (07)a
.   .   .   .   .   .   .   .

Y-DCT (70)a . . . . . . . . . . . Y-DCT (77)a

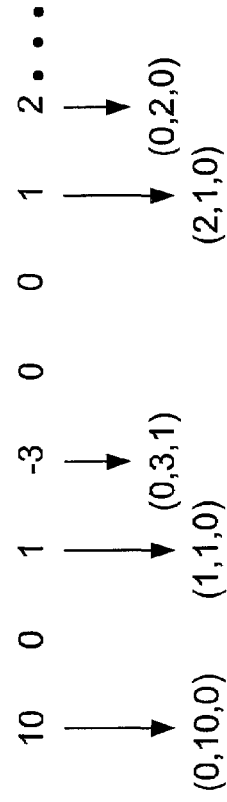
FIG. 9A
(PRIOR ART)
(RUN, LEVEL, SIGN) . . . (EOB)
FIG. 9B
(PRIOR ART)
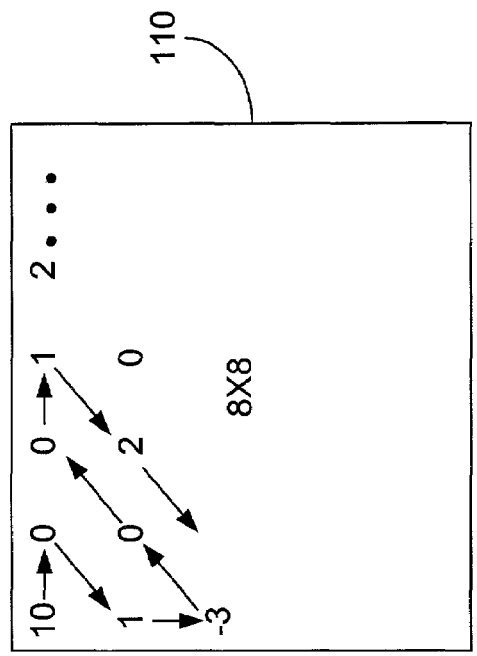
FIG. 8
(PRIOR ART)

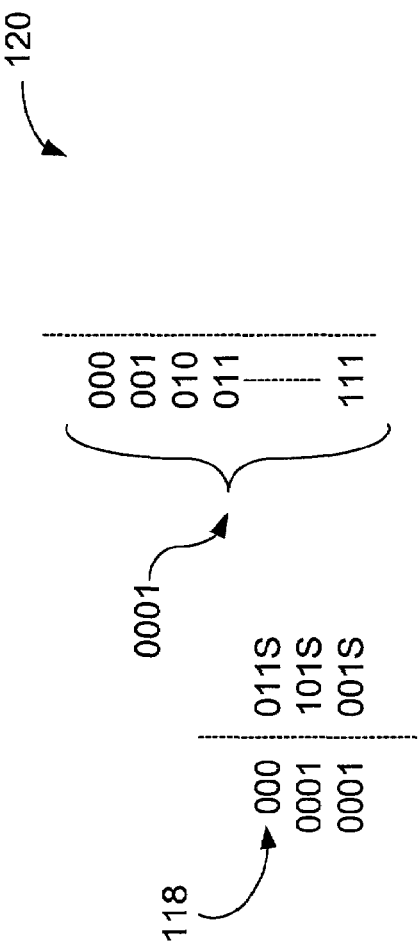

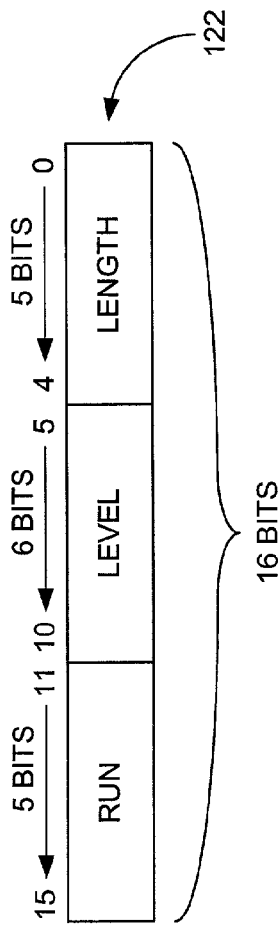
FIG. 12
(PRIOR ART)
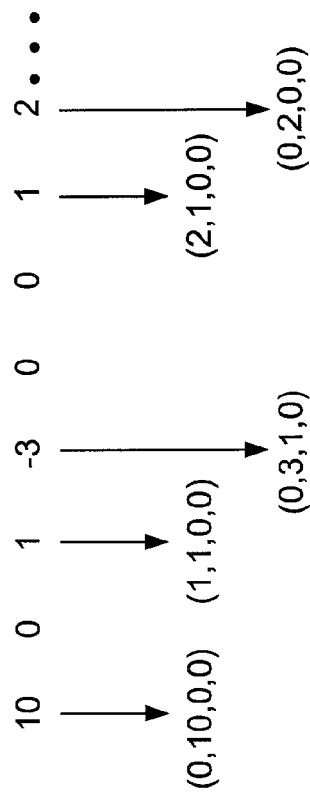
(RUN, LEVEL, SIGN, LAST)
FIG. 13B
(PRIOR ART)
FIG. 13A
(PRIOR ART)

P BLOCK NOT LAST SYMBOL

P BLOCK LAST SYMBOL

I BLOCK NOT LAST SYMBOL

I BLOCK LAST SYMBOL

BIT STREAM CODE LOOKUP TABLE FOR AN MPEG-4 CODE WORD

This application claims benefit under 35 U.S.C. §119 (e) of provisional application 60/301,866 filed Jun. 29, 2001.

GENERAL OVERVIEW OF CONVENTIONAL IMAGE-COMPRESSION TECHNIQUES

To help the reader more easily understand the concepts discussed below in the description of the invention, following is a basic overview of conventional image-compression techniques.

To electronically transmit a relatively high-resolution image over a relatively low-band-width channel, or to electronically store such an image in a relatively small memory space, it is often necessary to compress the digital data that represents the image. Such image compression typically involves reducing the number of data bits necessary to represent an image. For example, High-Definition-Television (HDTV) video images are compressed to allow their transmission over existing television channels. Without compression, HDTV video images would require transmission channels having bandwidths much greater than the bandwidths of existing television channels. Furthermore, to reduce data traffic and transmission time to acceptable levels, an image may be compressed before being sent over the internet. Or, to increase the image-storage capacity of a CD-ROM or server, an image may be compressed before being stored thereon.

Referring to FIGS. 1A–7, the basics of the popular block-based Moving Pictures Experts Group (MPEG) compression standards, which include MPEG-1, MPEG-2, and MPEG-4 are discussed. For purposes of illustration, the discussion is based on using an MPEG 4:2:0 format to compress video images represented in a Y, $C_B$, $C_R$ color space. However, the discussed concepts also apply to other MPEG formats, to images that are represented in other color spaces, and to other block-based compression standards such as the Joint Photographic Experts Group (JPEG) standard, which is often used to compress still images. Furthermore, although many details of the MPEG standards and the Y, $C_B$, $C_R$ color space are omitted for brevity, these details are well known and are disclosed in a large number of available references.

Still referring to FIGS. 1A–7, the MPEG standards are often used to compress temporal sequences of images—video frames for purposes of this discussion—such as those found in a television broadcast. Each video frame is divided into subregions called macro blocks, which each include one or more pixels. FIG. 1A is a 16-pixel-by-16-pixel macro block 30 having 256 pixels 32 (not drawn to scale). In the MPEG standards, a macro block is typically 16×16 pixels, although other compression standards may use macro blocks having other dimensions. In the original video frame, i.e., the frame before compression, each pixel 32 has a respective luminance value Y and a respective pair of color-, i.e., chroma-, difference values $C_B$ and $C_R$.

Referring to FIGS. 1D–1D, before compression of the frame, the digital luminance (Y) and chroma-difference ($C_B$ and $C_R$) values that will be used for compression, i.e., the pre-compression values, are generated from the original Y, $C_B$, and $C_R$ values of the original frame. In the MPEG 4:2:0 format, the pre-compression Y values are the same as the original Y values. Thus, each pixel 32 merely retains its original luminance value Y. But to reduce the amount of data to be compressed, the MPEG 4:2:0 format allows only one pre-compression $C_B$ value and one pre-compression $C_R$ value for each group 34 of four pixels 32. Each of these pre-compression $C_B$ and $C_R$ values are respectively derived from the original $C_B$ and $C_R$ values of the four pixels 32 in the respective group 34. For example, a pre-compression $C_B$ value may equal the average of the original $C_B$ values of the four pixels 32 in the respective group 34. Thus, referring to FIGS. 1B–1D, the pre-compression Y, $C_B$, and $C_R$ values generated for a macro block are arranged as one 16×16 matrix 36 of pre-compression Y values (equal to the original Y values for each respective pixel 32), one 8×8 matrix 38 of pre-compression $C_B$ values (equal to one derived $C_B$ value for each group 34 of four pixels 32), and one 8×8 matrix 40 of pre-compression $C_R$ values (equal to one derived $C_R$ value for each group 34 of four pixels 32). The matrices 36, 38, and 40 are often called "blocks" of values. Furthermore, because it is convenient to perform the compression transforms on 8×8 blocks of pixel values instead of on 16×16 blocks, the block 36 of pre-compression Y values is subdivided into four 8×8 blocks 42a–42d, which respectively correspond to the 8×8 blocks A–D of pixels in the macro block 30. Thus, referring to FIGS. 1A–1D, six 8×8 blocks of pre-compression pixel data are generated for each macro block 30: four 8×8 blocks 42a–42d of pre-compression Y values, one 8×8 block 38 of pre-compression $C_B$ values, and one 8×8 block 40 of pre-compression $C_R$ values.

FIG. 2 is a block diagram of an MPEG compressor 50, which is more commonly called an encoder. Generally, the encoder 50 converts the pre-compression data for a frame or sequence of frames into encoded data that represent the same frame or frames with significantly fewer data bits than the pre-compression data. To perform this conversion, the encoder 50 reduces or eliminates redundancies in the pre-compression data and reformats the remaining data using efficient transform and coding techniques.

More specifically, the encoder 50 includes a frame-reorder buffer 52, which receives the pre-compression data for a sequence of one or more frames and reorders the frames in an appropriate sequence for encoding. Thus, the reordered sequence is often different than the sequence in which the frames are generated and will be displayed. The encoder 50 assigns each of the stored frames to a respective group, called a Group Of Pictures (GOP), and labels each frame as either an intra (I) frame or a non-intra (non-I) frame. For example, each GOP may include three I frames and twelve non-I frames for a total of fifteen frames. The encoder 50 always encodes an I frame without reference to another frame, but can and often does encode a non-I frame with reference to one or more of the other frames in the GOP. The encoder 50 does not, however, encode a non-I frame with reference to a frame in a different GOP.

Referring to FIGS. 2 and 3, during the encoding of an I frame, the 8×8 blocks (FIGS. 1B–1D) of the pre-compression Y, $C_B$, and $C_R$ values that represent the I frame pass through a summer 54 to a Discrete Cosine Transformer (DCT) 56, which transforms these blocks of values into respective 8×8 blocks of one DC (zero frequency) transform value and sixty-three AC (non-zero frequency) transform values. FIG. 3 is a block 57 of luminance transform values Y-DCT$_{(0, 0)a}$–Y-DCT$_{(7, 7)a}$, which correspond to the pre-compression luminance pixel values Y$_{(0, 0)a}$–Y$_{(7, 7)a}$ in the block 36 of FIG. 1B. Thus, the block 57 has the same number of luminance transform values Y-DCT as the block 36 has of luminance pixel values Y. Likewise, blocks of chroma transform values $C_B$-DCT and $C_R$-DCT (not shown) correspond to the chroma pixel values in the blocks 38 and 40. Furthermore, the pre-compression Y, $C_B$, and $C_R$ values pass through the summer 54 without being summed with any other values because the summer 54 is not needed when the encoder 50 encodes an I frame. As discussed below, however, the summer 54 is often needed when the encoder 50 encodes a non-I frame.

Referring to FIG. 2 and FIG. 4, a quantizer and zigzag scanner 58 limits each of the transform values from the DCT 56 to a respective maximum value, and provides the quantized AC and DC transform values on respective paths 60 and 62. FIG. 4 is an example of a zigzag scan pattern 63, which the quantizer and zigzag scanner 58 may implement. Specifically, the quantizer and scanner 58 reads the transform values in the transform block (such as the transform block 57 of FIG. 3) in the order indicated. Thus, the quantizer and scanner 58 reads the transform value in the "0" position first, the transform value in the "1" position second, the transform value in the "2" position third, and so on until it reads the transform value in the "63" position last. The quantizer and zigzag scanner 58 reads the transform values in this zigzag pattern to increase the coding efficiency as is known. Of course, depending upon the coding technique and the type of images being encoded, the quantizer and zigzag scanner 58 may implement other scan patterns too.

Referring again to FIG. 2, a prediction encoder 64 predictively encodes the DC transform values, and a variable-length coder 66 converts the quantized AC transform values and the quantized and predictively encoded DC transform values into variable-length codes such as Huffman codes. These codes form the encoded data that represent the pixel values of the encoded I frame. A transmit buffer 68 then temporarily stores these codes to allow synchronized transmission of the encoded data to a decoder (discussed below in conjunction with FIG. 6). Alternatively, if the encoded data is to be stored instead of transmitted, the coder 66 may provide the variable-length codes directly to a storage medium such as a CD-ROM.

If the I frame will be used as a reference (as it often will be) for one or more non-I frames in the GOP, then, for the following reasons, the encoder 50 generates a corresponding reference frame by decoding the encoded I frame with a decoding technique that is similar or identical to the decoding technique used by the decoder (FIG. 6). When decoding non-I frames that are referenced to the I frame, the decoder has no option but to use the decoded I frame as a reference frame. Because MPEG encoding and decoding are lossy— some information is lost due to quantization of the AC and DC transform values—the pixel values of the decoded I frame will often be different than the pre-compression pixel values of the original I frame. Therefore, using the pre-compression I frame as a reference frame during encoding may cause additional artifacts in the decoded non-I frame because the reference frame used for decoding (decoded I frame) would be different than the reference frame used for encoding (pre-compression I frame).

Therefore, to generate a reference frame for the encoder that will be similar to or the same as the reference frame for the decoder, the encoder 50 includes a dequantizer and inverse zigzag scanner 70, and an inverse DCT 72, which are designed to mimic the dequantizer and scanner and the inverse DCT of the decoder (FIG. 6). The dequantizer and inverse scanner 70 first implements an inverse of the zigzag scan path implemented by the quantizer 58 such that the DCT values are properly located within respective decoded transform blocks. Next, the dequantizer and inverse scanner 70 dequantizes the quantized DCT values, and the inverse DCT 72 transforms these dequantized DCT values into corresponding 8×8 blocks of decoded Y, $C_B$, and $C_R$ pixel values, which together compose the reference frame. Because of the losses incurred during quantization, however, some or all of these decoded pixel values may be different than their corresponding pre-compression pixel values, and thus the reference frame may be different than its corresponding pre-compression frame as discussed above. The decoded pixel values then pass through a summer 74 (used when generating a reference frame from a non-I frame as discussed below) to a reference-frame buffer 76, which stores the reference frame.

During the encoding of a non-I frame, the encoder 50 initially encodes each macro-block of the non-I frame in at least two ways: in the manner discussed above for I frames, and using motion prediction, which is discussed below. The encoder 50 then saves and transmits the resulting code having the fewest bits. This technique insures that the macro blocks of the non-I frames are encoded using the fewest bits.

With respect to motion prediction, an object in a frame exhibits motion if its relative position changes in the preceding or succeeding frames. For example, a horse exhibits relative motion if it gallops across the screen. Or, if the camera follows the horse, then the background exhibits relative motion with respect to the horse. Generally, each of the succeeding frames in which the object appears contains at least some of the same macro blocks of pixels as the preceding frames. But such matching macro blocks in a succeeding frame often occupy respective frame locations that are different than the respective frame locations they occupy in the preceding frames. Alternatively, a macro block that includes a portion of a stationary object (e.g., tree) or background scene (e.g., sky) may occupy the same frame location in each of a succession of frames, and thus exhibit "zero motion". In either case, instead of encoding each frame independently, it often takes fewer data bits to tell the decoder "the macro blocks R and Z of frame 1 (non-I frame) are the same as the macro blocks that are in the locations S and T, respectively, of frame 0 (reference frame)." This "statement" is encoded as a motion vector. For a relatively fast moving object, the location values of the motion vectors are relatively large. Conversely, for a stationary or relatively slow-moving object or background scene, the location values of the motion vectors are relatively small or equal to zero.

FIG. 5 illustrates the concept of motion vectors with reference to the non-I frame 1 and the reference frame 0 discussed above. A motion vector $MV_R$ indicates that a match for the macro block in the location R of frame 1 can be found in the location S of a reference frame 0. $MV_R$ has three components. The first component, here 0, indicates the frame (here frame 0) in which the matching macro block can be found. The next two components, $X_R$ and $Y_R$, together comprise the two-dimensional location value that indicates where in the frame 0 the matching macro block is located. Thus, in this example, because the location S of the frame 0 has the same X-Y coordinates as the location R in the frame 1, $X_R=Y_R=0$. Conversely, the macro block in the location T matches the macro block in the location Z, which has different X-Y coordinates than the location T. Therefore, $X_Z$ and $Y_Z$ represent the location T with respect to the location Z. For example, suppose that the location T is ten pixels to the left of (negative X direction) and seven pixels down from (negative Y direction) the location Z. Therefore, $MV_Z=(0, -10, -7)$. Although there are many other motion-vector schemes available, they are all based on the same general concept. For example, the locations R may be bidirectionally encoded. That is, the location R may have two motion vectors that point to respective matching locations in different frames, one preceding and the other succeeding the frame 1. During decoding, the pixel values of these matching locations are averaged or otherwise combined to calculate the pixel values of the location.

Referring again to FIG. 2, motion prediction is now discussed in detail. During the encoding of a non-I frame, a motion predictor 78 compares the pre-compression Y values—the $C_B$ and $C_R$ values are not used during motion prediction—of the macro blocks in the non-I frame to the decoded Y values of the respective macro blocks in the reference I frame and identifies matching macro blocks. For each macro block in the non-I frame for which a match is found in the I reference frame, the motion predictor 78 generates a motion vector that identifies the reference frame and the location of the matching macro block within the reference frame. Thus, as discussed below in conjunction with FIG. 6, during decoding of these motion-encoded macro blocks of the non-I frame, the decoder uses the motion vectors to obtain the pixel values of the motion-encoded macro blocks from the matching macro blocks in the reference frame. The prediction encoder 64 predictively encodes the motion vectors, and the coder 66 generates respective codes for the encoded motion vectors and provides these codes to the transmit buffer 68.

Furthermore, because a macro block in the non-I frame and a matching macro block in the reference I frame are often similar but not identical, the encoder 50 encodes these differences along with the motion vector so that the decoder can account for them. More specifically, the motion predictor 78 provides the decoded Y values of the matching macro block of the reference frame to the summer 54, which effectively subtracts, on a pixel-by-pixel basis, these Y values from the pre-compression Y values of the matching macro block of the non-I frame. These differences, which are called residuals, are arranged in 8×8 blocks and are processed by the DCT 56, the quantizer and scanner 58, the coder 66, and the buffer 68 in a manner similar to that discussed above, except that the quantized DC transform values of the residual blocks are coupled directly to the coder 66 via the line 60, and thus are not predictively encoded by the prediction encoder 64.

In addition, it is possible to use a non-I frame as a reference frame. When a non-I frame will be used as a reference frame, the quantized residuals from the quantizer and zigzag scanner 58 are respectively dequantized, reordered, and inverse transformed by the dequantizer and inverse scanner 70 and the inverse DCT 72, respectively, so that this non-I reference frame will be the same as the one used by the decoder for the reasons discussed above. The motion predictor 78 provides to the summer 74 the decoded Y values of the reference frame from which the residuals were generated. The summer 74 adds the respective residuals from the inverse DCT 72 to these decoded Y values of the reference frame to generate the respective Y values of the non-I reference frame. The reference-frame buffer 76 then stores the reference non-I frame along with the reference I frame for use in motion encoding subsequent non-I frames.

Although the circuits 58 and 70 are described as performing the zigzag and inverse zigzag scans, respectively, in other embodiments, another circuit may perform the zigzag scan and the inverse zigzag scan may be omitted. For example, the coder 66 can perform the zigzag scan and the circuit 58 can perform the quantization only. Because the zigzag scan is outside of the reference-frame loop, the dequantizer 70 can omit the inverse zigzag scan. This saves processing power and processing time.

Still referring to FIG. 2, the encoder 50 also includes a rate controller 80 to insure that the transmit buffer 68, which typically transmits the encoded frame data at a fixed rate, never overflows or empties, i.e., underflows. If either of these conditions occurs, errors may be introduced into the encoded data stream. For example, if the buffer 68 overflows, data from the coder 66 is lost. Thus, the rate controller 80 uses feed back to adjust the quantization scaling factors used by the quantizer/scanner 58 based on the degree of fullness of the transmit buffer 68. Specifically, the fuller the buffer 68, the larger the controller 80 makes the scale factors, and the fewer data bits the coder 66 generates. Conversely, the more empty the buffer 68, the smaller the controller 80 makes the scale factors, and the more data bits the coder 66 generates. This continuous adjustment insures that the buffer 68 neither overflows or underflows.

FIG. 6 is a block diagram of a conventional MPEG decompresser 82, which is commonly called a decoder and which can decode frames that are encoded by the encoder 50 of FIG. 2.

Referring to FIGS. 6 and 7, for I frames and macro blocks of non-I frames that are not motion predicted, a variable-length decoder 84 decodes the variable-length codes received from the encoder 50. A prediction decoder 86 decodes the predictively decoded DC transform values, and a dequantizer and inverse zigzag scanner 87, which is similar or identical to the dequantizer and inverse zigzag scanner 70 of FIG. 2, dequantizes and rearranges the decoded AC and DC transform values. Alternatively, another circuit such as the decoder 84 can perform the inverse zigzag scan. An inverse DCT 88, which is similar or identical to the inverse DCT 72 of FIG. 2, transforms the dequantized transform values into pixel values. For example, FIG. 7 is a block 89 of luminance inverse-transform values Y-IDCT, i.e., decoded luminance pixel values, which respectively correspond to the luminance transform values Y-DCT in the block 57 of FIG. 3 and to the pre-compression luminance pixel values $Y_a$ of the block 42$a$ of FIG. 1B. But because of losses due to the quantization and dequantization respectively implemented by the encoder 50 (FIG. 2) and the decoder 82 (FIG. 6), the decoded pixel values in the block 89 are often different than the respective pixel values in the block 42$a$.

Still referring to FIG. 6, the decoded pixel values from the inverse DCT 88 pass through a summer 90—which is used during the decoding of motion-predicted macro blocks of non-I frames as discussed below—into a frame-reorder buffer 92, which stores the decoded frames and arranges them in a proper order for display on a video display unit 94. If a decoded frame is used as a reference frame, it is also stored in the reference-frame buffer 96.

For motion-predicted macro blocks of non-I frames, the decoder 84, dequantizer and inverse scanner 87, and inverse DCT 88 process the residual transform values as discussed above for the transform values of the I frames. The prediction decoder 86 decodes the motion vectors, and a motion interpolator 98 provides to the summer 90 the pixel values from the reference-frame macro blocks to which the motion vectors point. The summer 90 adds these reference pixel values to the residual pixel values to generate the pixel values of the decoded macro blocks, and provides these decoded pixel values to the frame-reorder buffer 92. If the encoder 50 (FIG. 2) uses a decoded non-I frame as a reference frame, then this decoded non-I frame is stored in the reference-frame buffer 96.

Referring to FIGS. 2 and 6, although described as including multiple functional circuit blocks, the encoder 50 and the decoder 82 may be implemented in hardware, software, or a combination of both. For example, the encoder 50 and the decoder 82 are often implemented by a respective one or more processors that perform the respective functions of the circuit blocks.

Coding 10A and 10B

Run-Length Encoding Scheme of MPEG-4 as Compared to MPEG-2

Referring to FIG. 8, the basics of the run-length encoding scheme of MPEG-2 and MPEG-4 are discussed, their differences being highlighted.

FIG. 8 is an 8×8 block 110 of encoded and quantized DC and AC coefficient values that will form part of a transmitted encoded bit stream. Because the DC coefficient (which is typically nonzero) and most of the nonzero AC coefficients are in the upper left-hand corner of the block 110, MPEG-2 and MPEG-4 use zigzag scanning (described by the arrows and discussed above in conjunction with FIG. 4) to form the unencoded stream. The zigzag-scanned bit stream often includes long strings of zeroes, which can be encoded into fewer bits as described below.

Referring to FIGS. 9A and 9B, the zigzag-scanned bit stream of FIG. 8 is encoded as shown. Specifically, referring to FIG. 9B, each non-zero element of the bit stream is encoded using three numbers that respectively represent run, level, and sign. "Run" is the number of zeroes that precede the non-zero element, "level" is the magnitude of the non-zero element, and "sign" is the polarity (positive or negative) of the nonzero element. For example, referring to FIG. 9A, the first element 10 is encoded as run=0, level=10, and sign=0 (positive), and the next non-zero element, 1, is encoded as run=1 (a single preceding zero since the last zero element), level=1, and sign=0. Similarly, −3 is encoded as run=0, level=3, and sign=1 (negative), 1 is encoded as run=2 (two preceding zeroes), level=1, and sign=0, and 2 is encoded as run=0, level=2, and sign=0.

When the entire block 110 has been coded, an end-of-block (EOB) value, which in MPEG-2 is run=0, level=0, and sign=0, is generated in the bit stream. The decoder (not shown) uses this EOB value to determine where one block ends and the next block begins. The MPEG-4 EOB value is discussed below.

Referring to FIG. 10, after each of the coefficients in the 8×8 block 110 of FIG. 8 has been encoded as run, level, and sign as described above in conjunction with FIGS. 9A and 9B, the encoded coefficients are converted into a variable-length code (VLC) as shown in Table I of FIG. 10. For example, 0,1,0 may be converted into 011S (S=0) and 3,2,1 may be converted into 010110S (s=1) where "S" indicates the sign bit, which equals the sign of the encoded coefficient.

The Method that the Equator MAP 1000 Processor Uses for Decoding the MPEG-2 VLC Encoded Bit Stream The equator MAP processor is described in U.S. patent application Ser. No. 09/750,383 and is incorporated by reference. The MAP 1000 actually includes two processors, a VLX processor and a core processor.

Referring to FIG. 11, the method that the VLX processor uses for decoding the VLC encoded bit stream is described. Generally, the VLX looks for the number of leading zeros of the first code word that represents a block of values. Based on the number of leading zeros, the VLX knows from which section of a look-up table 120 it must obtain the run, level, and sign values of the run-length-limited (RLL) code word corresponding to the VLC code word. The values that follow the leading zeros are used to pinpoint the exact values in the table. For example, a VLC word 118 has three leading zeros. Consecutive leading zeros are always followed by a 1. Following the 1 is the end section of the VLC word 118, which in this example includes three bits (0,1,1) plus a sign bit S for a total of four bits. So the VLX processor goes to the section of the table 120 that include RLL code words that respectively correspond to all VLC words that begin with 0001, and converts the VLC word 118 into the RLL code word stored for 011 (which may be adjusted to accommodate the sign bit S). The stored RLL code word includes the run, the level, and the sign bit as discussed above, and thus allows the VLX to recover the DC and AC DCT=transform s of the 8×8 block 110 (FIG. 8). The stored value also includes the length of the VLC word 118. The length is in bits and represents the combined length of the leading zeros, the subsequent 1, and the remaining bits of the VLC word 118. The sign S is also incorporated into the length value. Because the code words are not fixed length, the VLX uses the length to determine where (in the bit stream) one VLC word ends and the next VLC word begins.

Still referring to FIG. 11, the registers in the VLX processor are constructed to store one or more 16-bit words. For example, the VLX processor has 64-bit registers that are each designed to store and allow manipulation of four 16-bit words. That is, each 64-bit register can act as four respective 16-bit registers. Therefore, the RLL code words (which include run, level, and length values) of the table 120 are designed to be 16 bits so that they can fit into the VLX's 16-bit registers. Specifically, the MPEG-2 standard specifies that the maximum size of the run value is 5 bits, the maximum size of the level value is 6 bits, and the maximum size of the length value (including sign) is 5 bits. Therefore, the maximum length of a decoded RLL word stored in the table 120 is 5+5+6=16 bits. One can construct the table of FIG. 11 such that it stores the appropriate sign bit based on the sign bit of the bit stream, or, to save table space, one can actually add the sign bit to the stored RLL code word in the table 120 after the RLL code word (without sign bit) is retrieved from the table 120. Typically, the sign bit is the last bit of the RLL code word from the table 120. Since it is the last bit, the sign bit can be considered to be separate from the preceding RLL code word. In this case, the sign bit is the bit after the end of the RLL code word. If the sign bit read is '1', it means 'level' value is negative. In this case, 'level' is multiplied by '−1'. Otherwise, if the sign bit read is '0', the level value is positive and is just left as is.

Referring to FIG. 12, a VLX register 122 is partitioned into run (5 bits), level (6 bits), and length (5 bits) sections to store the run, level, and length (includes sign) values of the RLL code words. The run value (5 bits) occupies bit positions 11–15, the level value (6 bits) occupies bit positions 5–10, and the length value (5 bits) occupies bit positions 0–4.

The VLX processor recognizes an EOB (the end of an 8×8 block of coefficients) flag as an RLL code word from table 120 (FIG. 11) having all 5 bits of the length value (bit positions 0–4 of the register 22) set equal to zero.

MPEG-4 Encoding

Referring to FIGS. 13A and 13B, the encoding technique defined by the MPEG-4 standard is discussed. Referring to FIGS. 13A and 13B and comparing them to FIGS. 9A and 9B, the MPEG-4 scheme for zigzag scanning and for RLL encoding the coefficients of the block 110 (FIG. 8) is similar to the MPEG-2 scheme except that the MPEG-4 scheme adds an additional bit, called a "last" bit, to the RLL code word. Therefore, the RLL code word has four values: run, level, sign, and last. The last bit effectively substitutes for the EOB symbol of MPEG-2. That is, if a coefficient in the bit stream of FIG. 13A is the last quantized non zero coefficient in the 8×8 block 110 (FIG. 8), then the last bit of the corresponding RLL code word is set equal to a value, for example logic 1, to indicate this. For all other coefficients of the block 110, the last bit of the corresponding RLL code word is set to an opposite value, for example logic 0, to indicate that the corresponding coefficient is not the last coefficient of the block 110.

An additional difference between the MPEG-2 and MPEG-4 encoding/decoding scheme is that MPEG-4 encodes I frames and P frames differently (MPEG-2 encodes both I and P frames using the technique described above in conjunction with FIGS. 11–12). In MPEG-4, for an I frame, the run value is 5 bits, the level value is 3 bits (with a range from 1–6), and the length value is 4 bits (with a range from 5–13). For an MPEG-4 P frame, the run value is 6 bits, the level value is 2 bits (with a range from 1–3), and the length value is 4 bits (with a range from 5–13).

Use of the VLX Processor to Decode an MPEG-4 Bitstream

The addition of the "last" bit to the RLL code words prevents the VLX processor from using the MPEG-2 decode scheme of FIGS. 11–12 to decode an MPEG-4 bit stream. One could design a new VLX processor that has circuitry specifically designed for MPEG-4 decoding. But this is expensive and does not provide a low-cost solution to customers or end users who are already using existing (MPEG-2) versions of the VLX processor.

BRIEF DESCRIPTION OF THE DRAWINGS

FIGS. 1C and 1D are diagrams of conventional blocks of pre-compression chroma values that respectively correspond to the pixel groups in the macro block of FIG. 1A.

FIG. 3 is a block diagram of luminance transform values that are generated by the encoder of FIG. 2 and that respectively correspond to the pre-compression luminance pixel values of FIG. 1B.

FIG. 8 is an example diagram of a zigzag sampling pattern of encoded and quantized DC and AC coefficient values.

FIG. 9A shows the encoding of the zigzag scanned bit stream of FIG. 8 and FIG. 9B shows the MPEG-2 bit stream convention.

FIG. 10 is a table showing how encoded coefficients are further encoded into a variable-length-code.

FIG. 11 shows examples and a table used to decode the variable-length-code in MPEG-2 in a VLX processor.

FIG. 12 is a diagram of the partitioning of a VLX processor's 16-bit register.

FIG. 13A shows the encoding of the zigzag scanned bit stream of FIG. 8 for MPEG-4 and FIG. 13B shows the MPEG-4 bit stream convention.

SUMMARY OF THE INVENTION

In one aspect of the invention four tables are implemented to transform MPEG-4 code tables into MPEG-2 code tables, such that an MPEG-2 processor can be used to decode an MPEG-4 bit stream.

DESCRIPTION OF THE EMBODIMENTS OF THE INVENTION

Referring again to FIGS. 10–13B, the decoding tables of the MAP processor—which was designed for the MPEG-2 standard—have been rearranged to work with the MPEG-4 standard. As discussed above, for an MPEG-4 I block, the run field is 5 bits, the level field is 3 bits, and the length field is 4 bits, and for an MPEG-4 P block, run is 6 bits, level is 2 bits, and length is 4 bits. Furthermore, the MAP decode registers are partitioned as shown in FIG. 12 to accommodate MPEG-2, where run is 5 bits, level is 6 bits, and length is 5 bits. To indicate the end of a block in MPEG-2, length of the EOB symbol equals zero. But for MPEG-4, length is never zero because there is no EOB symbol.

Figures 1A, 1B:
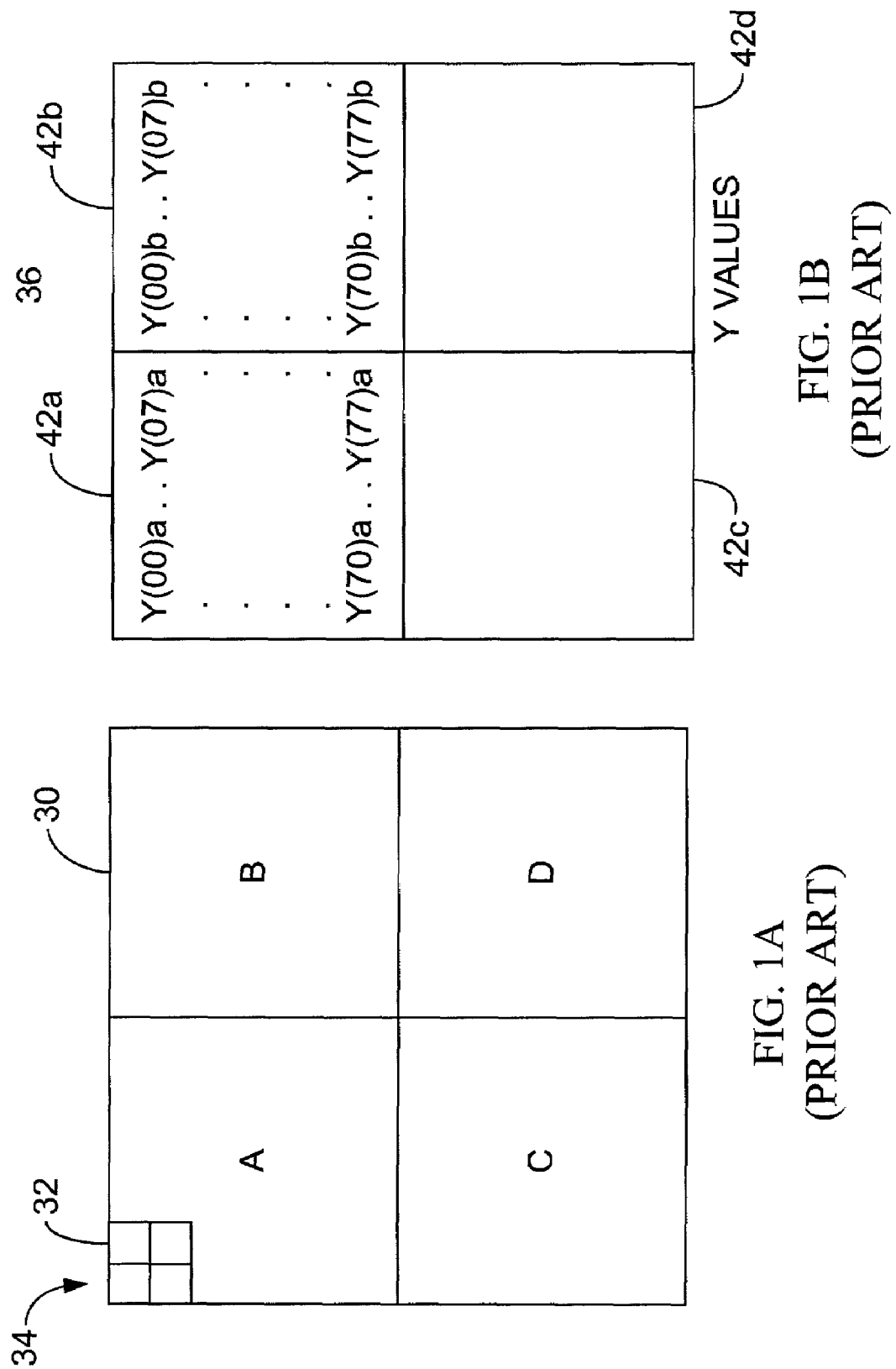
FIG. 1A is a diagram of a conventional macro block of pixels in an image.
FIG. 1B is a diagram of a conventional block of pre-compression luminance values that respectively correspond to the pixels in the macro block of FIG. 1A.
Figure 2:
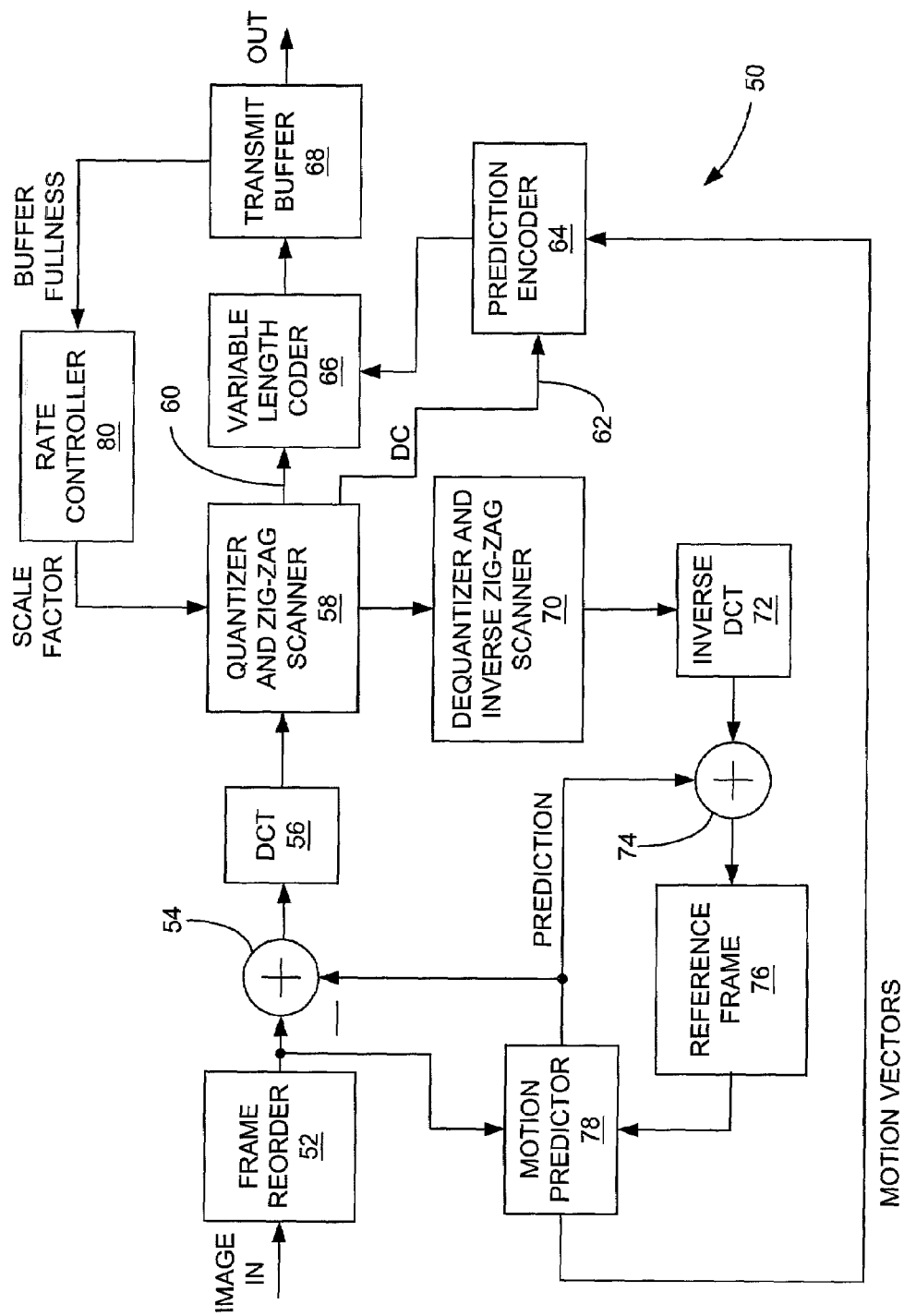
FIG. 2 is a block diagram of a conventional MPEG encoder.
Figure 4:
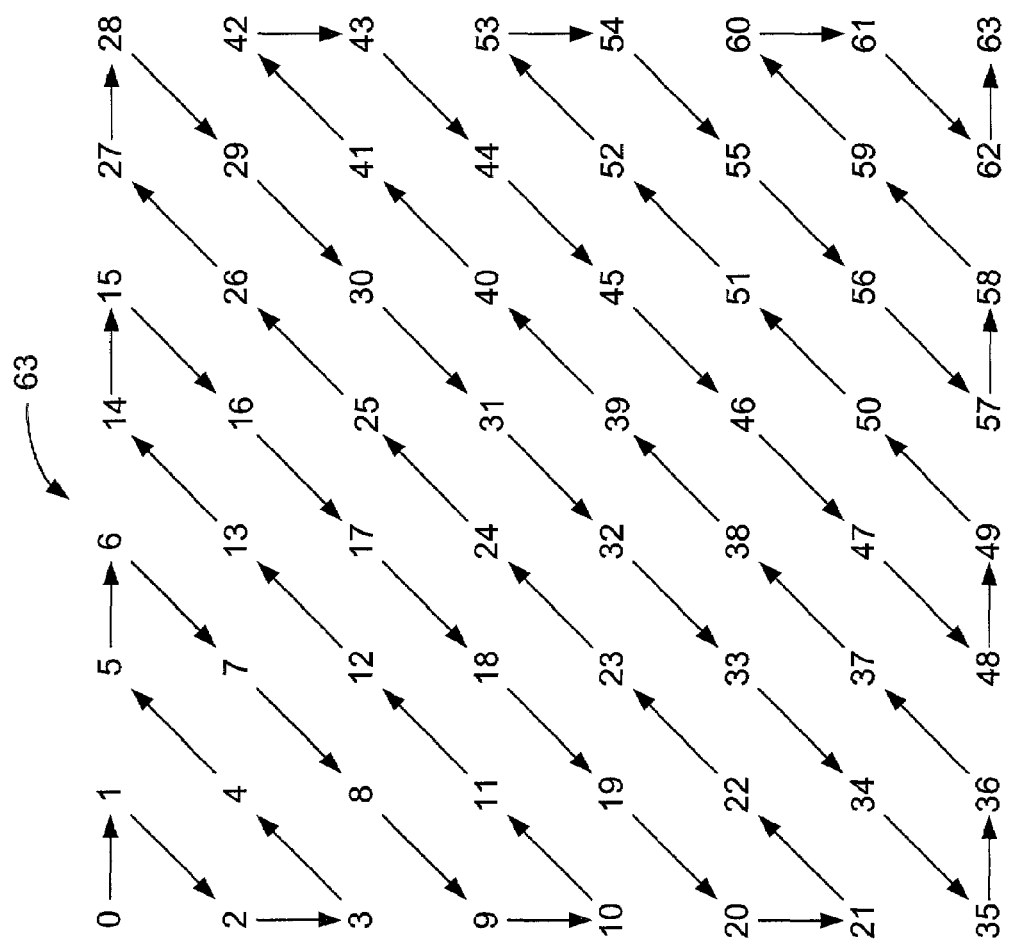
FIG. 4 is a conventional zigzag sampling pattern that can be implemented by the quantizer and zigzag scanner of FIG. 2.
Figure 5:
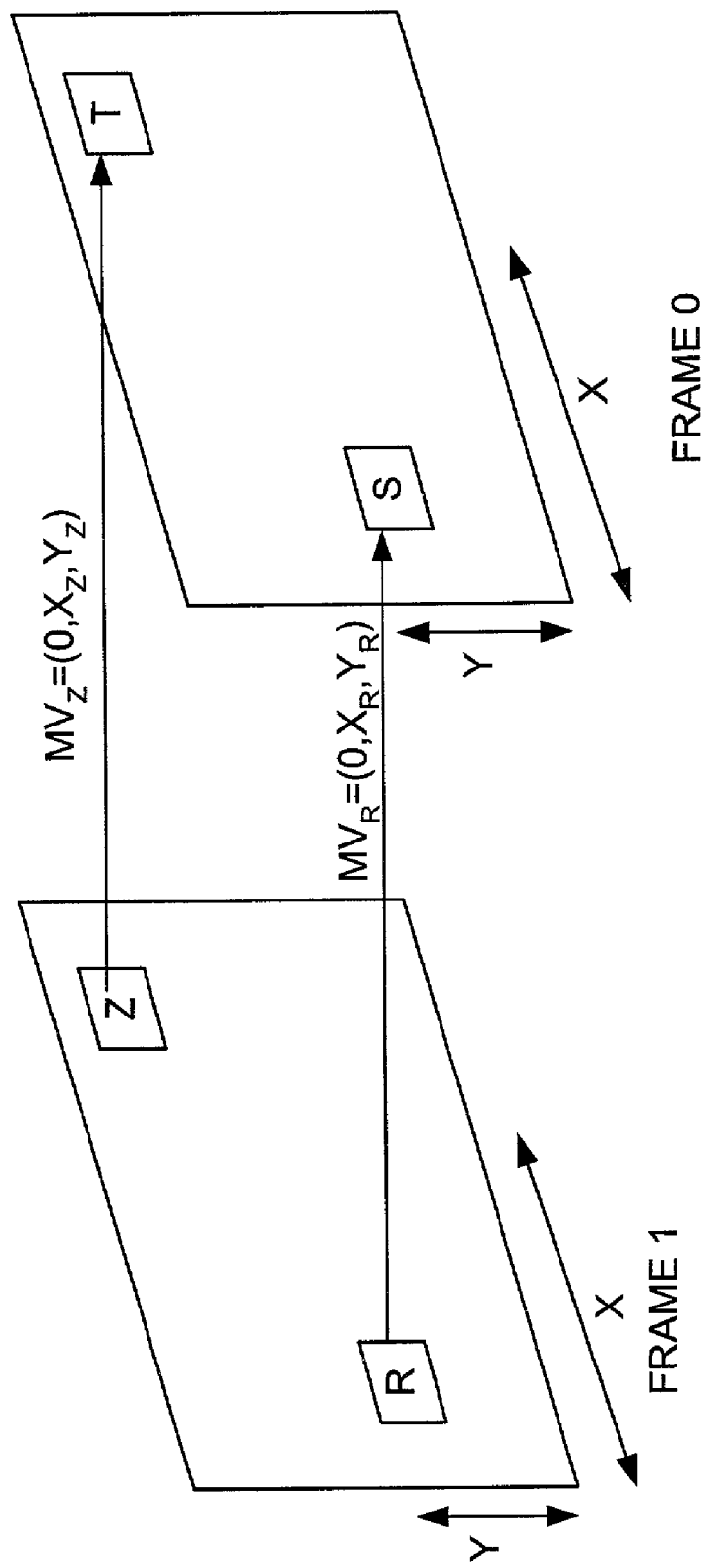
FIG. 5 illustrates the concept of conventional motion vectors.
Figure 6:
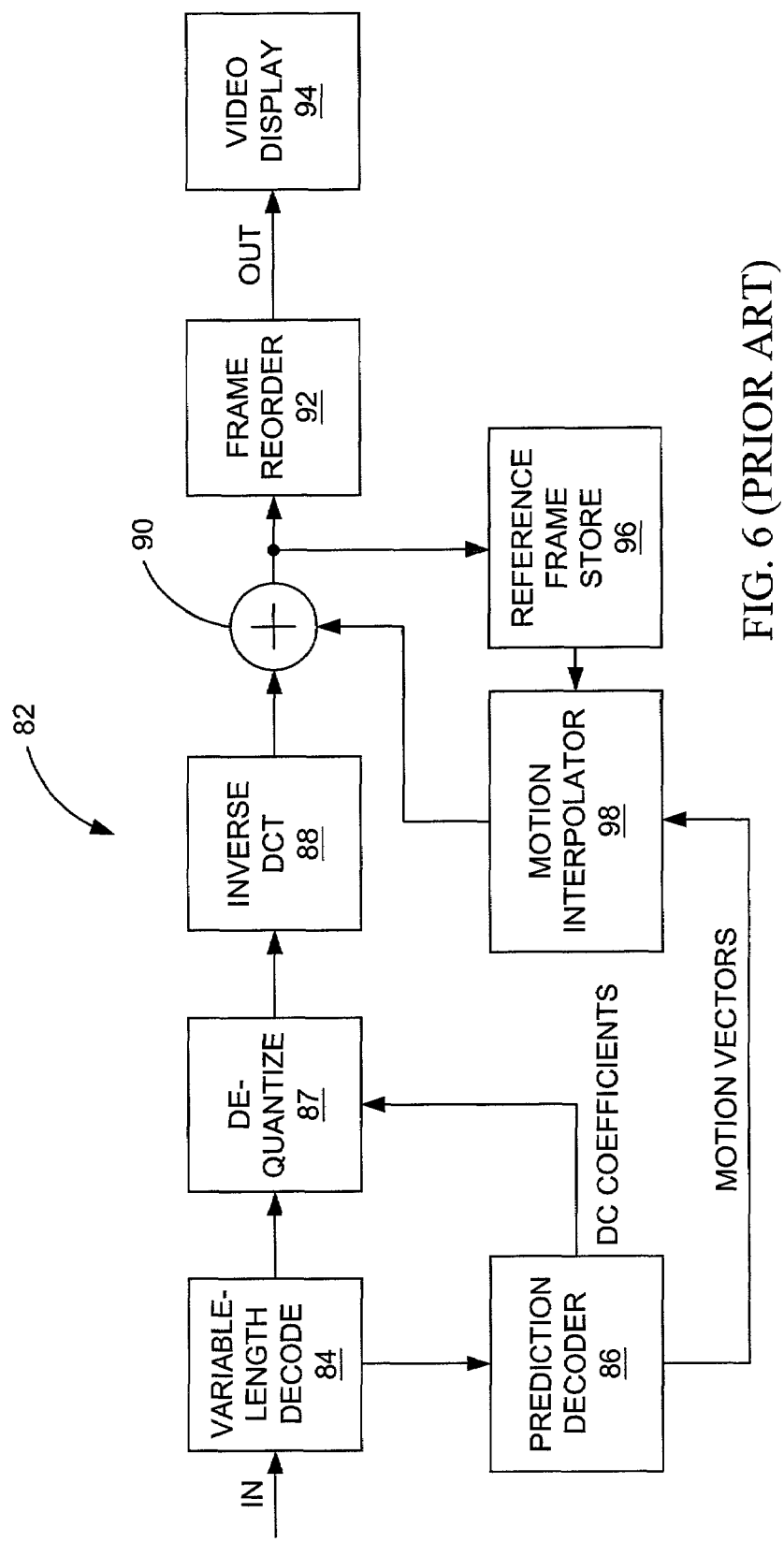
FIG. 6 is a block diagram of a conventional MPEG decoder.
Figure 7:
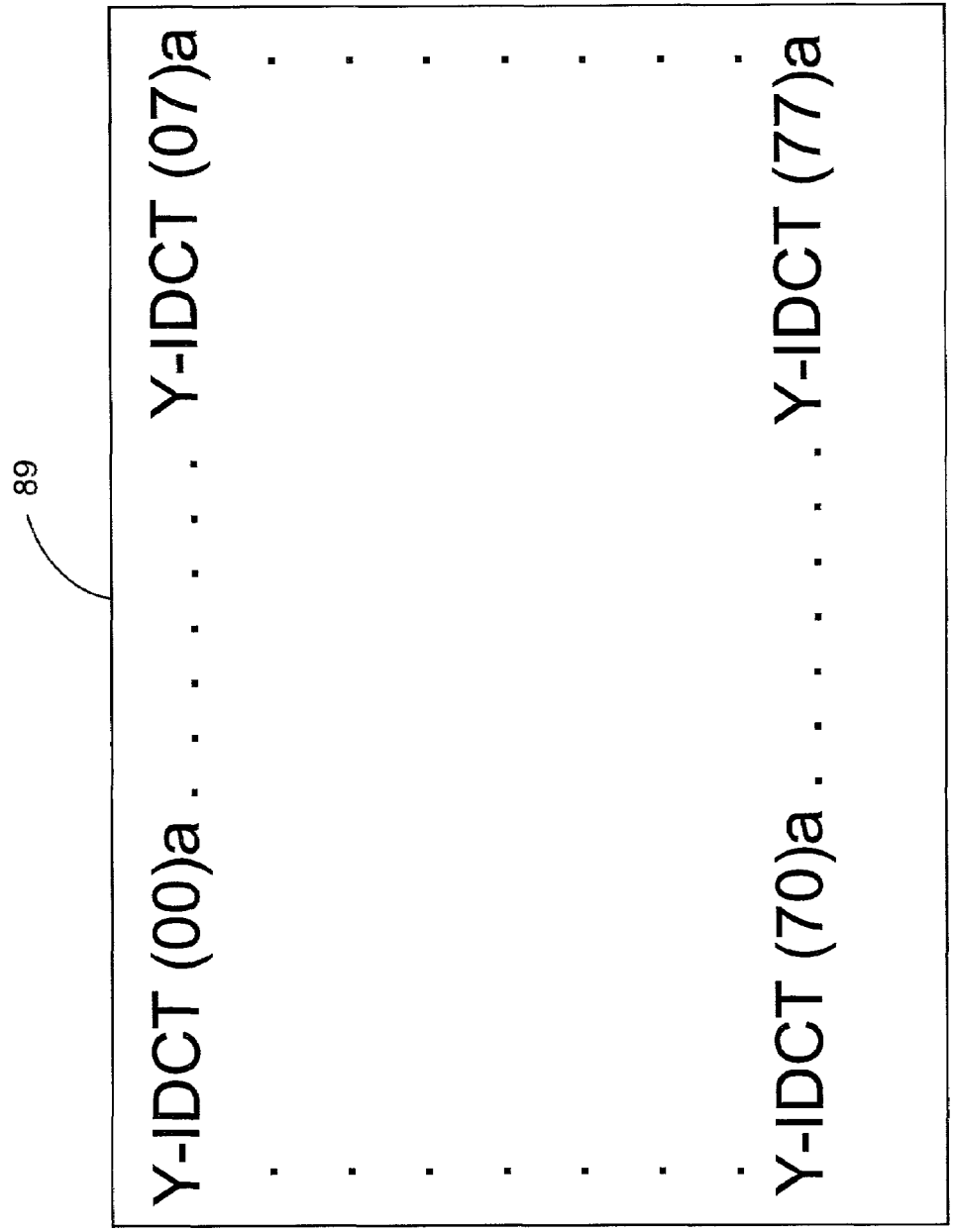
FIG. 7 is a block of inverse transform values that are generated by the decoder of FIG. 6 and that respectively correspond to the luminance transform values of FIG. 3 and the pre-compression luminance pixel values of FIG. 1B.
Figure 14A:
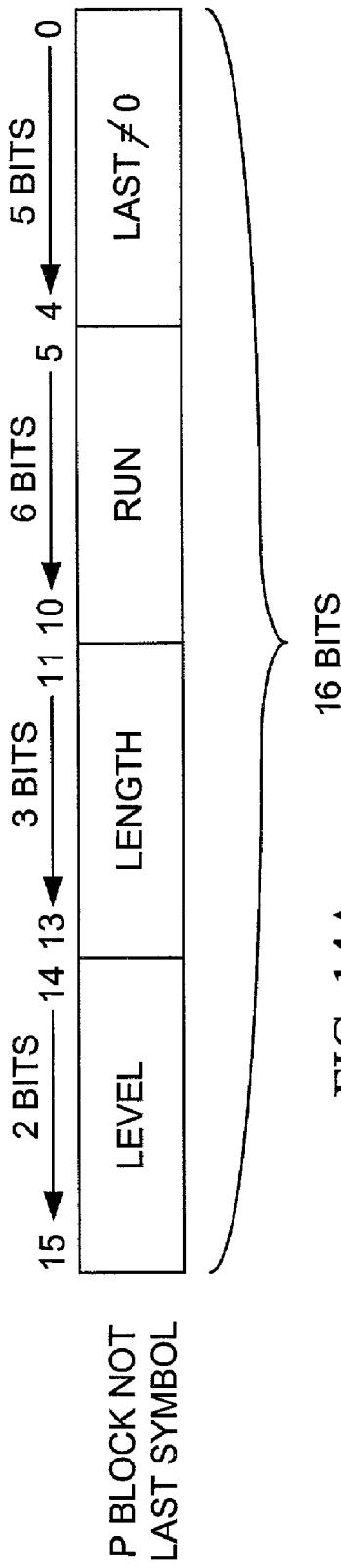
FIGS. 14A–14D is a set of diagrams of the partitioning of 16-bit registers for four cases for the VLX processor to accommodate MPEG-4.

Specifically, the registers in the decode tables of the MAP are arranged, via software, as shown in FIGS. 14A–14D. There are four decode tables (or a single table that is divided into four sections) that store respective decoded symbols as follows:

FIG. 14A The symbol belongs to a P block and is not the last symbol of the block (last field≠0). Level=2 bits (14–15), length=3 bits (11–13), run=6 bits (5–10), last=5 bits (0–4).

Figure 14B:
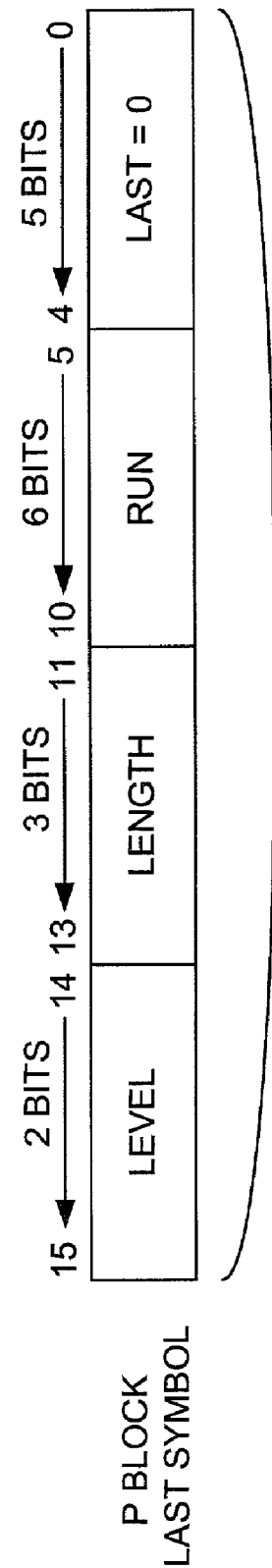

FIG. 14B The symbol belongs to a P block and is the last symbol of the block (last field=0). Level=2 bits (14–15), length=3 bits (11–13), run=6 bits (5–10), last=5 bits (0–4).

Figure 14C:
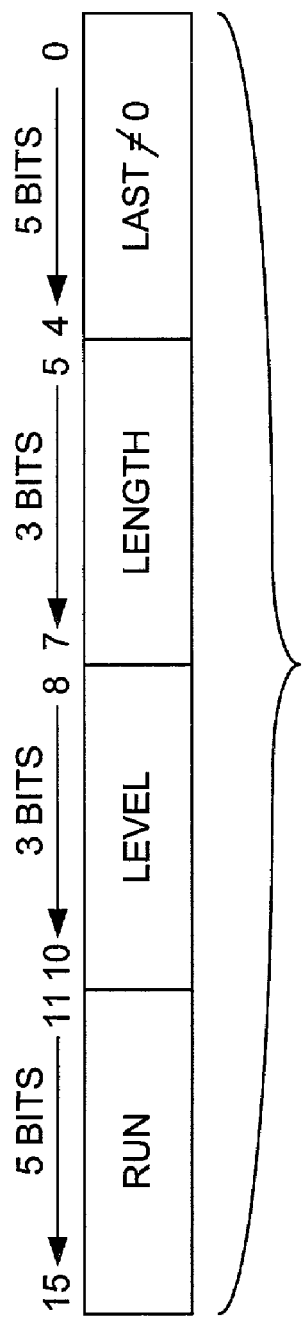

FIG. 14C The symbol belongs to an I block and is not the last symbol of the block (last field≠0). Level=3 bits (8–10), length=3 bits (5–7), run=5 bits (11–15), last=5 bits (0–4)

Figure 14D:
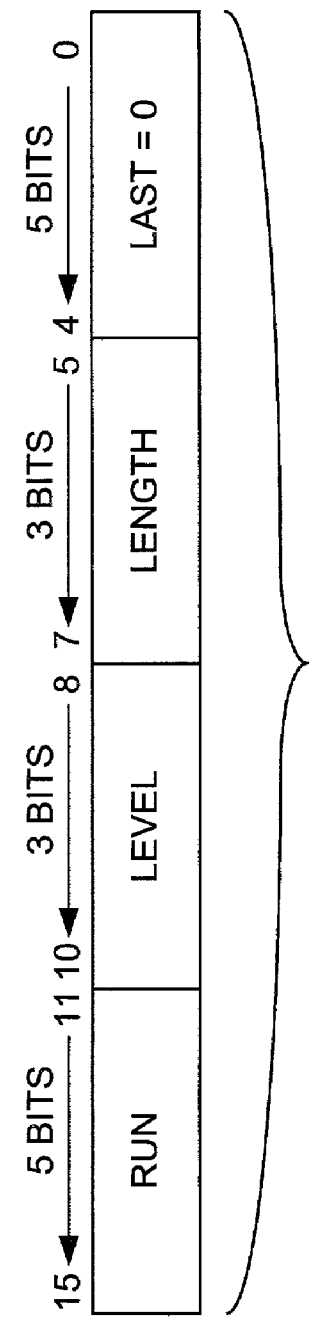

FIG. 14D The symbol belongs to an I block and is the last symbol of the block (last field=0). Level=3 bits (8–10), length=3 bits (5 7), run=5 bits (11–15), last=5 bits (0–4)

With this scheme, the MAP processor retains its 5-6-5 portion of its 16-bit registers (FIG. 12) and retains its EOB indicator, i.e., where the last 5 bits of the 16-bit decode register (the 5-bit length field in FIG. 12, the 5-bit last field in FIG. 14A–14D) equal zero.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

What is claimed:

1. A video processing circuit comprising:
a storage circuit operable to store decode tables; and
a processor operable to
transform the decode tables from a first format enabling decoding of images encoded according to a first MPEG standard to a second format enabling decoding of images encoded according to a second MPEG standard;

receive images encoded according to the first MPEG standard, determine the decode table to be used;

calculate a run-length-limited code for each variable length code received; and decode said run length limited code in hardware designed for decoding images encoded in the second MPEG standard.

2. The video processing circuit of claim 1 wherein all decode table entries contain an MPEG-2 end-of-block field.

3. The video processing circuit of claim 1 wherein determining the decode table to be used comprises:

determining whether a macro block being processed is a P macro block or a I macro block; and determining if a symbol being processed is the last symbol of the current macro block.

4. The video processing circuit of claim 1 wherein:

storing the decode tables comprises:

setting the 5-bit last field non-zero when the symbol belongs to a P macro block and is not the last symbol of the block;

setting the 5-bit last field to zero when the symbol belongs to a P macro block and is the last symbol of the block;

setting the 5-bit last field non-zero when the symbol belongs to an intraframe macro block and is not the last symbol of the block;

setting the 5-bit last field to zero when the symbol belongs to an intraframe macro block and is the last symbol of the block.

5. The video processing circuit of claim 1 wherein calculating a run length limited code for each variable length code received comprises:

constructing a 16-bit four field run-length limited word where last is the first 5 bits, and run is the next six bits, and length is the next three bits, and level is the next two bits and where last is non-zero when the current symbol is not the last symbol of a predicted frame macro block and last is zero when the current symbol is the last symbol of a predicted frame macro block; and constructing a 16-bit four field run-length-limited word where last is the first five bits, and length is the next three bits, and level is the next three bits, and run is the next five bits and where last is non-zero when the current symbol is not the last symbol of an intraframe macro block and last is zero when the current symbol is the last symbol of an intraframe macro block.

6. A method comprising:

transforming decode tables from a first format enabling decoding of images encoded according to a first MPEG standard to a second format enabling decoding of images encoded according to a second MPEG standard;

determining the decode table to be used for an image encoded according to the first MPEG standard; and calculating a run-length-limited code for each variable length code received; and decoding said run length limited code in hardware designed for decoding images encoded in the second MPEG standard.

7. The method of claim 6 wherein:

the first MPEG standard is MPEG-4; and the second MPEG standard is MPEG-2.

8. The method of claim 6 wherein determining the decode table to be used comprises:

determining the type of macro block being processed to be a P macro block or a I macro block; and determining if a symbol being processed is the last symbol of the macro block.

9. The method of claim 6 wherein decoding the run-length-limited code comprises:

setting the 5-bit last field non-zero when the symbol belongs to a P macro block and is not the last symbol of the block;

setting the 5-bit last field to zero when the symbol belongs to a P macro block and is the last symbol of the block;

setting the 5-bit last field non-zero when the symbol belongs to an I macro block and is not the last symbol of the block;

setting the 5-bit last field to zero when the symbol belongs to an I macro block and is the last symbol of the block.

10. The method of claim 6 wherein decoding a run-length-limited code for each variable length code received comprises:

constructing a 16-bit four-field run-length-limited word where level is the last two bits, length is the next three bits, run is the next six bits, last is the next five bits and where last is non-zero when the current symbol is not the last symbol of a P macro block and last is zero when the current symbol is the last symbol of a P macro block; and constructing a 16-bit four-field run-length-limited word where run is the last five bits, level is the next three bits, length is the next three bits, and last is the next five bits and where last is non-zero when the current symbol is not the last symbol of an I macro block and last is zero when the current symbol is the last symbol of an I macro block.

* * * * *